United States Patent [19]

Smith

[11] Patent Number: 4,888,665
[45] Date of Patent: Dec. 19, 1989

[54] CUSTOMIZABLE CIRCUITRY

[75] Inventor: Lawrence N. Smith, Austin, Tex.

[73] Assignee: Microelectronics and Computer Technology Corporation, Austin, Tex.

[21] Appl. No.: 158,172

[22] Filed: Feb. 19, 1988

[51] Int. Cl.⁴ .............................................. H05K 1/02
[52] U.S. Cl. .................................. 361/400; 174/68.5; 361/406; 361/416
[58] Field of Search ............... 174/68.5; 361/414, 400, 361/406, 416

[56] References Cited

U.S. PATENT DOCUMENTS

| | | | |
|---|---|---|---|
| 3,398,232 | 8/1968 | Hoffman | 174/68.5 |
| 3,680,005 | 7/1972 | Jorgensen et al. | 361/414 X |
| 3,875,479 | 4/1975 | Jaggar | 174/68.5 X |
| 3,877,051 | 4/1975 | Calhoun et al. | 174/68.5 X |
| 3,895,181 | 7/1975 | La Grange et al. | 361/414 X |
| 4,438,560 | 3/1984 | Kisters | 174/68.5 X |
| 4,598,166 | 7/1986 | Neese | 361/414 X |
| 4,652,974 | 3/1987 | Ryan | 361/395 |
| 4,750,089 | 6/1988 | Derryberry et al. | 361/398 X |
| 4,779,340 | 10/1988 | Kihm et al. | 174/68.5 X |
| 4,791,238 | 12/1988 | Kanno et al. | 174/68.5 |
| 4,803,595 | 2/1989 | Kraus | 361/416 X |
| 4,808,769 | 2/1989 | Nakano et al. | 174/68.5 |
| 4,811,082 | 3/1989 | Jacobs et al. | 174/68.5 X |

OTHER PUBLICATIONS

G. Kutch, Edge Definition as Related to Angled Electrode Lands, IBM Tech. Disc. Bull., vol. 13, #12, May 1971, p. 3653 relied on.

Primary Examiner—R. R. Kucia
Attorney, Agent, or Firm—Arnold, White & Durkee

[57] ABSTRACT

A customizable circuit using a programmable interconnect and a compatible tape design for tape automated bonding of chips to the circuitry. The programmable interconnect comprises layers of wires, with one layer of wires forming overlap regions with the adjacent layer of wires. The wires can be selectively linked later to form the desired interconnect. The selective linkage represents the customization of an otherwise undedicated interconnect. The TAB chip bonding design uses a carrier tape to bond the integrated circuit chips to the programmable interconnect. Also disclosed is a method for forming the interconnect.

19 Claims, 8 Drawing Sheets

CUSTOMIZABLE CIRCUITRY

BACKGROUND OF THE INVENTION

The present invention relates to customizable circuitry, and particularly to customizable circuitry which includes an interconnect for receiving and electrically connecting electrical devices and tape designs for bonding chips to the interconnect. The invention relates to an interconnect which can be produced in gross with an undedicated, universal structure and subsequently customized to a specific application with minimal effort and fabrication, and to a tape design and bonding pad design for bonding chips to the interconnect. Further, the invention also concerns a method for manufacturing the interconnect.

Customizable circuitry, as used herein, refers to that circuitry in which some of the device interconnections are not made during the initial manufacture of the circuitry, but are deferred. This deferral allows the circuitry to be manufactured in large quantities with generic properties, with the specific design details being applied later by the user in a final step called "customization." Integral to customizable circuitry is a generic interconnect structure coupled with a method of bonding the leads of integrated circuit chips to that interconnect structure.

Interconnects, as building blocks for electronic circuitry and microcircuitry, typically receive and support further electrical devices, for example, substrates, i.e., smaller scale interconnects, integrated chips, capacitors, resistors and so forth, which can be electrically connected to one another to provide larger, more complex electrical structures. The interconnects typically have a sandwich-type structure through which a series of wires extend. The wires connect the electrical devices attached to the interconnect according to a plan specified by the interconnect user.

The interconnects are used in a multiplicity of designs, each requiring unique electrical circuitry. Presently, in a majority of the interconnects, the wiring plan is fixed at an early stage of manufacture. In other words, the manufacturer lays down the interconnect wiring according to a specific, predetermined plan. Such interconnects will be referred to as "design specific." As is readily apparent, design specific interconnects cannot be mass produced, except for high volume applications, and are, therefore, time and cost intensive.

There is a need in the interconnect industry for an interconnect design which could be mass-produced in an unspecified manner and thereafter programmed to produce whatever wiring plan is required by the user. Such interconnects will be referred to as "programmable interconnects" and the final step of imposing the wiring plan on the interconnect will be referred to as "customization."

A previous attempt at programmable interconnect design is disclosed in U.S. Pat. No. 4,458,297 to Mosaic Systems, Inc. The Mosaic design provides interconnect wiring in the form of a grid with wires in one direction forming one plane and orthogonal wires forming a second plane. Positioned between the two sets of wires is a layer of amorphous silicon which, though originally non-conductive, can be rendered conductive at specified points of wire overlap. The selective conductivity is achieved through crystallization of the amorphous silicon by applying a voltage differential across the orthogonal wires. The electric field produced by this voltage differential causes the silicon in the region of the overlapped wires to crystallize and become conductive. Therefore, a electrical path is formed between the overlapped wires.

The Mosaic structure is advantageous in that it provides for the mass production of undedicated interconnects which can be customized by the manufacturer or by the end user at a later stage of manufacture. The major disadvantage of the Mosaic technology is that all of the interconnects must be electrically accessible from the edges of the substrate in order to program the discretionary connections. In other words, all of the interconnects extend across the entire length (or width) of the substrate. This limits the possible configurations of the interconnect and severely limits the number of interconnects which a given substrate can accommodate to a small fraction of what could be accommodated using a custom interconnect with the same density of wires. Another problem is that this process leaves sections of wire connected to the desired interconnect network which are not needed (except for the programming and test functions) which degrades the performance of the interconnect. Finally, the Mosaic process is additive only. That is, the wire routing is formed by adding electrically conductive segments, i.e., the crystallized silicon bridges. It is very difficult, if not impossible, to undo any connections which have been previously made. Thus, changes to previously programmed substrates, which might be desired to implement design changes, are impractical.

Turning now to the problem of mounting the integrated circuit chips, it is conventional practice to mount such chips on interconnect structures which serve to electrically connect the chips. To achieve efficiency in the resulting customizable circuit, it is important to match the chip bonding technique used to the particular interconnect structure. One technique often used for such mounting is "Tape Automated Bonding" (TAB) in which the integrated circuit chips are mounted on a carrier film or tape.

Accordingly, there exists a need in the art for an improved customizable circuitry including a programmable interconnect which can be mass produced to include an unspecified wiring plan and which can be subsequently specified in the later stages of manufacture or by the end-user with a minimum of effort and time, and which can provide a dense interconnect structure which can be practiced at both the printed circuit and integrated circuit levels, and a bond pad design compatible with such interconnects.

SUMMARY OF THE INVENTION

It is, therefore, an object of the present invention to provide improved customizable circuitry.

Additionally, an object of the present invention is to provide an interconnect for customizable circuitry which can be produced as an undedicated interconnect and then customized based on user needs.

Yet another object of the present invention is to provide a low cost interconnect.

Still yet another object of the invention is to provide an interconnect which can be customized in a simple manner with minimal fabrication.

A further object of the present invention is to provide an interconnect having a consistent wiring design which allows for ease in testing and manufacturing.

A still further object of the present invention is to provide an interconnect having predictable discontinuity effects and similar crossover loading for all lines.

Yet still another object of the invention is to provide a single interconnect which can accommodate a plurality of designs with only minor modification.

Additionally, it is an object of the invention to provide an interconnect which can serve at a variety of levels including packaging or other higher level interconnects.

Also, an object of the invention is to provide a process for forming an interconnect as defined above which involves the steps of forming an undedicated interconnect in which the wires are accessible, and subsequently customizing the interconnect with a minimum of effort and fabrication.

It is another object of the present invention to provide an improved tape design for tape automated bonding of chips to the customizable circuitry.

An additional object of the present invention is to provide an improved tape design which reduces the required alignment accuracy for outer lead bonding.

Still another object of the present invention is to provide relatively short tape leads which can be used for low inductance power connections.

It is a still further object of the present invention to provide an improved tape design which is compatible with a programmable interconnect of the type described above.

Therefore, in accordance with one aspect of the present invention, there is provided a customizable circuitry, comprising a programmable interconnect as described below, and an electrical component bonded to the interconnect at a plurality of bondsites by leads or bumps extending from the electrical component, wherein the bondsites are positioned in an area array comprising a plurality of parallel rows.

The use of a programmable interconnect in conjunction with a tape automated bonding technique provides a customizable circuit having wide application. Since neither the interconnect nor the bonding techniques are restricted to a particular process technology, the resulting programmable circuitry can be manufactured by a wide variety of process technologies, unlike customizable circuitry manufactured with an electrically programmable interconnect such as that made by Mosaic Systems, Inc. which requires the use of a particular silicon process.

In accordance with another aspect of the present invention, there is provided an interconnect for connecting electrical components, comprising a first set of essentially parallel wires, a second set of essentially parallel wires, non-planar and non-parallel to and forming areas of wire overlap with the first set of wires, and means, positioned about the interconnect, for bonding the interconnect to an attached electrical component. The wires are adaptable for selective linkage at the areas of wire overlap. In a preferred embodiment, the interconnect further comprises a conductive plane, preferably a power or ground plane or both.

Preferably, the interconnect includes an insulation layer in the form of strips which separates the two sets of overlapping wires.

The bonding means is in the form of a bonding pad which extends from the bottom plane of the interconnect through and above the interconnect for bonding to the electrical component, for example, a circuit chip. In one embodiment, the bonding means extends through the underlying substrate and mates with an extension, i.e, a "pin", extending from the substrate in the opposite direction. This allows for electrical connection to other components, such as printed circuit boards, or for convenient access to power supplies.

Also, the bonding means can connect to the programmable signal lines, and to the power and/or ground planes. If a resistive layer is provided for termination, it may also be connected to the bond pad.

In accordance with yet another aspect of the present invention, there is provided a method for forming an interconnect for receiving and electrically connecting electrical components, comprising the steps of preparing a programmable interconnect for connecting electrical components, comprising a first set of essentially parallel wires, a second set of essentially parallel wires non-planar and non-parallel to and forming areas of wire overlap with the first set of wires, and means positioned about the interconnect for bonding the interconnect to an attached electrical component, and customizing the programmable interconnect by selectively connecting the wires at the overlap areas and selectively cutting the wires to form a plurality of wire segments.

The present invention results in a high performance programmable interconnect. The high cost typically associated with design specific interconnects is significantly lowered by the use of the present undedicated programmable interconnect. Additionally, because a standard interconnect is produced each time, the volume and yield increase. By avoiding the use of fully custom wiring, the turnaround time is drastically reduced since the customizer becomes responsible for only a small fraction of overall fabrication.

In comparison to the presently available programmable interconnects, the present design is capable of a much denser construction. Density here refers to the number of conductors (wires) which ca be effectively utilized within a given interconnect area. As was previously noted, the electrically programmable interconnect of Mosaic is limited in its density by inherent material and/or processing requirements.

Further, the present interconnect design can utilize a variety of materials in comparison to the Mosaic design which is severely limited in its applicable materials.

Additionally, the consistent interconnect pattern allows for ease of testing, predictable discontinuity effects, similar cross-over loading for all lines, and good plating characteristics. The design also provides an inherent fault-tolerance by allowing route-around of non-functional wire segments. A test and repair strategy can also be employed at each step of the interconnect process, allowing potential yields of finished product to be quite high.

In accordance with an additional aspect of the present invention, there is provided a tape design for tape automated bonding of chips to the interconnect, comprising a carrier film, an integrated circuit chip positioned on the carrier film and a plurality of leads extending parallel from the chip and attached to the carrier film, the plurality of leads comprising an inner lead bonding portion and an outer lead bonding portion which includes bondsites, wherein the bondsites are positioned in an area array comprising a plurality of parallel rows, and access areas extending through the carrier film at the bondsites for providing access to the bondsites from an underlying interconnect.

The TAB tape design reduces the alignment accuracy required for outer lead bonding, provides a standard outer lead bond footprint to simplify the layout of the interconnect, allows the use of "generic" interconnects, provides short leads which can be used for low inductance power connections, and retains the advantage of compliancy which tape automated bonding gives. Additionally the tape design is compatible with the programmable interconnect structure to produce customizable circuitry of higher density and greater flexibility than presently available techniques.

Further objects, features and advantages of the present invention will be apparent from a review of the detailed description of preferred embodiments which follows, when considered together with the drawings, a brief description of which follows.

DETAILED DESCRIPTION OF PREFERRED EMBODIMENTS

Figure 1:
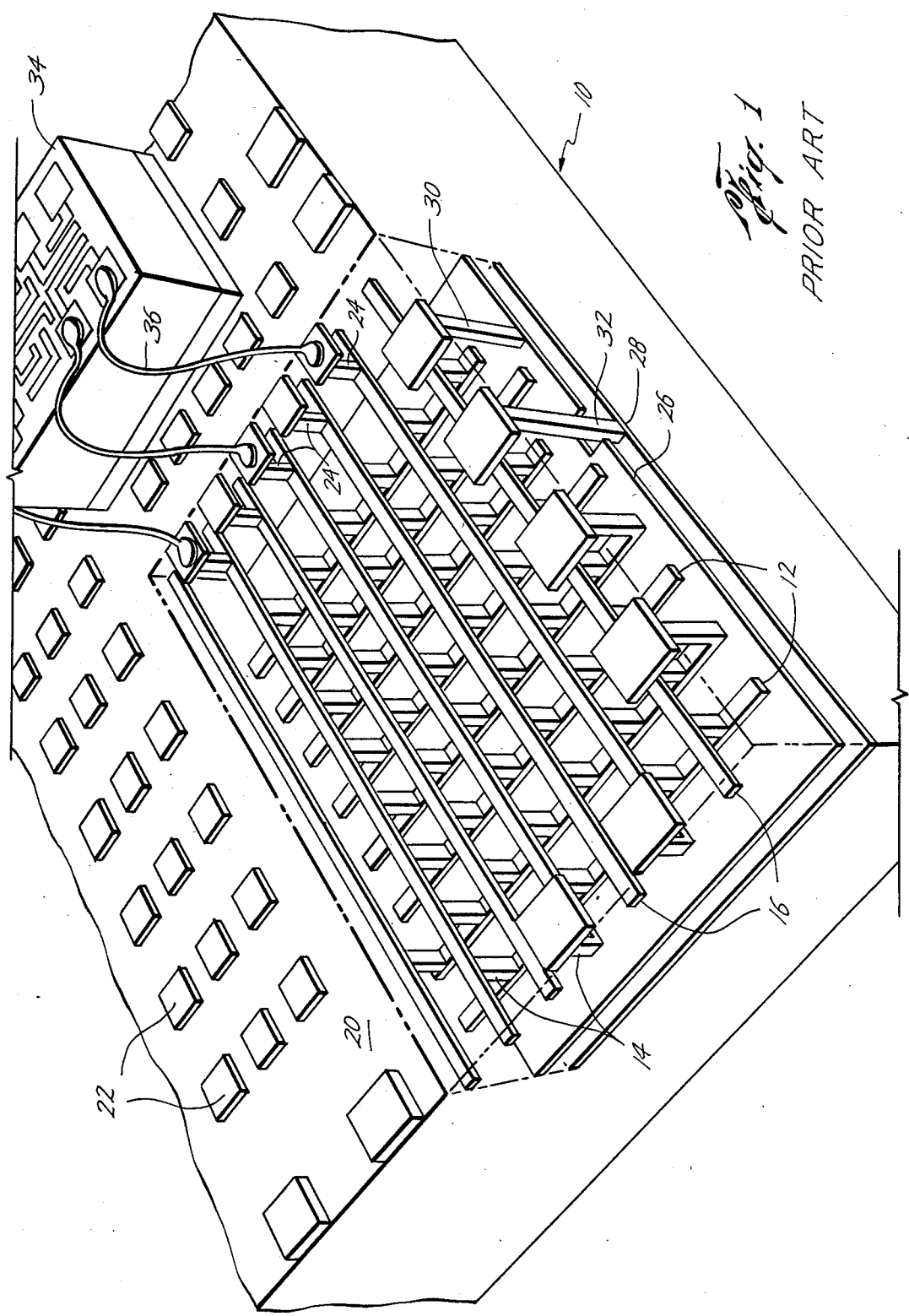
FIG. 1 is an isometric view of a presently available substrate.

FIG. 1 is an isometric, cut-away view illustrating one type of programmable interconnect design presently available, i.e., the Mosaic Systems, Inc. interconnect discussed previously. The substrate 10 includes a set of aluminum wires 12 extending parallel to one another and joined by amorphous silicon programmable bridges 14 to a set of aluminum wires 16 extending orthogonally to the wires 12. The silicon bridges are originally non-conductive amorphous silicon, but through crystallization under an electric field are rendered conductive. The wires 16 form a plane separate from and above the plane formed by the wires 12. The programmable bridges 14 form available electrical pathways between the wires 12 and 16. The wires are covered by the layer 20. The layer 20 is provided with a number of pads 22 which are connected electrically to the wires 16 by further bridges 24. The pads 22 are selectively connected to underlying voltage planes 26, 28 by extended bridges 30, 32, respectively. The pads 22, in turn, are connected to chips 34 by wire bonds 36 extending from the chips to the pads.

During the original phase of manufacture, the above design is not specified, i.e., a particular wiring scheme is not fixed. Once an application is identified and a specific wiring scheme determined, the programmable bridges can be electrically changed to conductive bridges, thus producing the requisite customized wiring scheme. While this design overcomes the limitations inherent in the design specific interconnects which require complete customization, it too is limited. Once a wire has been used to form one wire route, no matter how short a segment is needed, the entire wire must be used and thereby rendered incapable of receiving further routing; otherwise, the two routes would short circuit. The added length also degrades performance.

Figure 2:
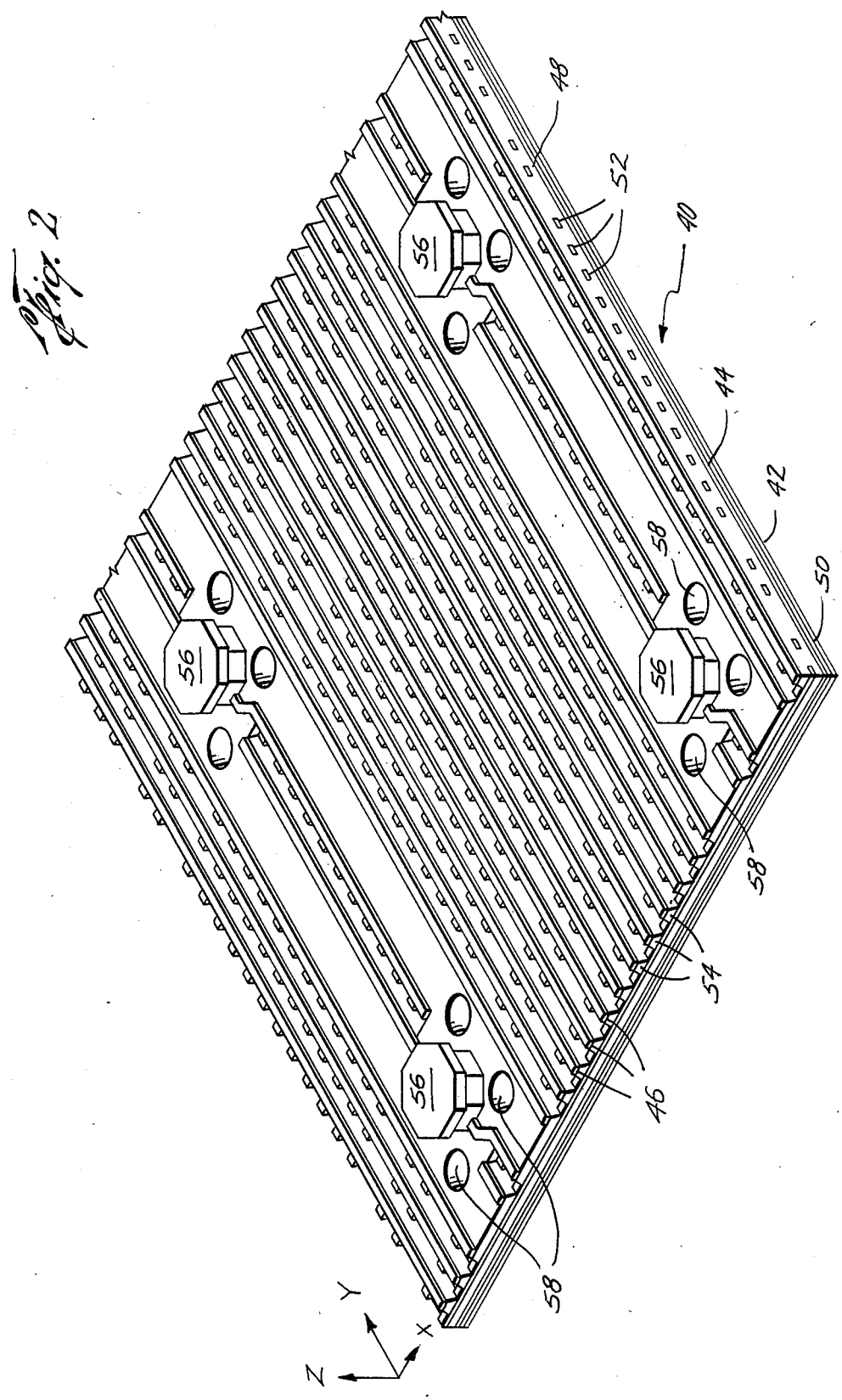
FIG. 2 is an isometric view of an interconnect according to the present invention.

The interconnect of the present invention has a sandwich structure. The actual number and types of layers depend on the particular application. FIG. 2 illustrates one type of interconnect structure according to the present invention. As illustrated, the interconnect 40 comprises an optional first plane 42. Plane 42 can be an electrically conductive plane, for example, a ground plane or a power plane. Additionally, both power and ground planes may be provided. As shown by FIG. 2, the interconnect contains both a power plane 42 and a ground plane 44. The actual number and type of planes will depend upon user needs. The conductive planes also help to control the impedance of the interconnect.

Extending above the plane 42 is a plurality of wires 52 which are labeled as x-axis wires for the sake of convenience and later reference. The wires 52 extend essentially parallel to one another and are coplanar. An insulation layer 48 is typically positioned between the plane 44 and the wires 52. Additionally, a further insulation layer 50 is provided between planes 42 and 44.

A second set of wires 46 is positioned above the wires 52 and extends essentially perpendicularly thereto. These wires have been marked as x-axis wires for the sake of convenience and later reference. The wires 46, like wires 52, extend essentially parallel to one another and are coplanar. The wires 46 and 52 form what will be referred to as y- and x-planes, respectively. An insulation layer 54, in the form of insulative strips, is provided between the x- and the y-wires. While the wires described here are orthogonally positioned, this is not required. Any relationship between the wires is possible, the only requirement being that the two sets of wires not be parallel so that the wires do overlap.

The interconnect 40 also includes a number of bonding structures 56 for conductively connecting the interconnect to an electrical component, for example, a tape automated bonded chip to be described in greater detail below. Additionally, access areas 58 are provided in the interconnect structure. These areas 58 provide access to the underlying ground and/or power planes. The access areas should be positioned so as to minimize interference with the wires 46 and 52.

Figure 3:
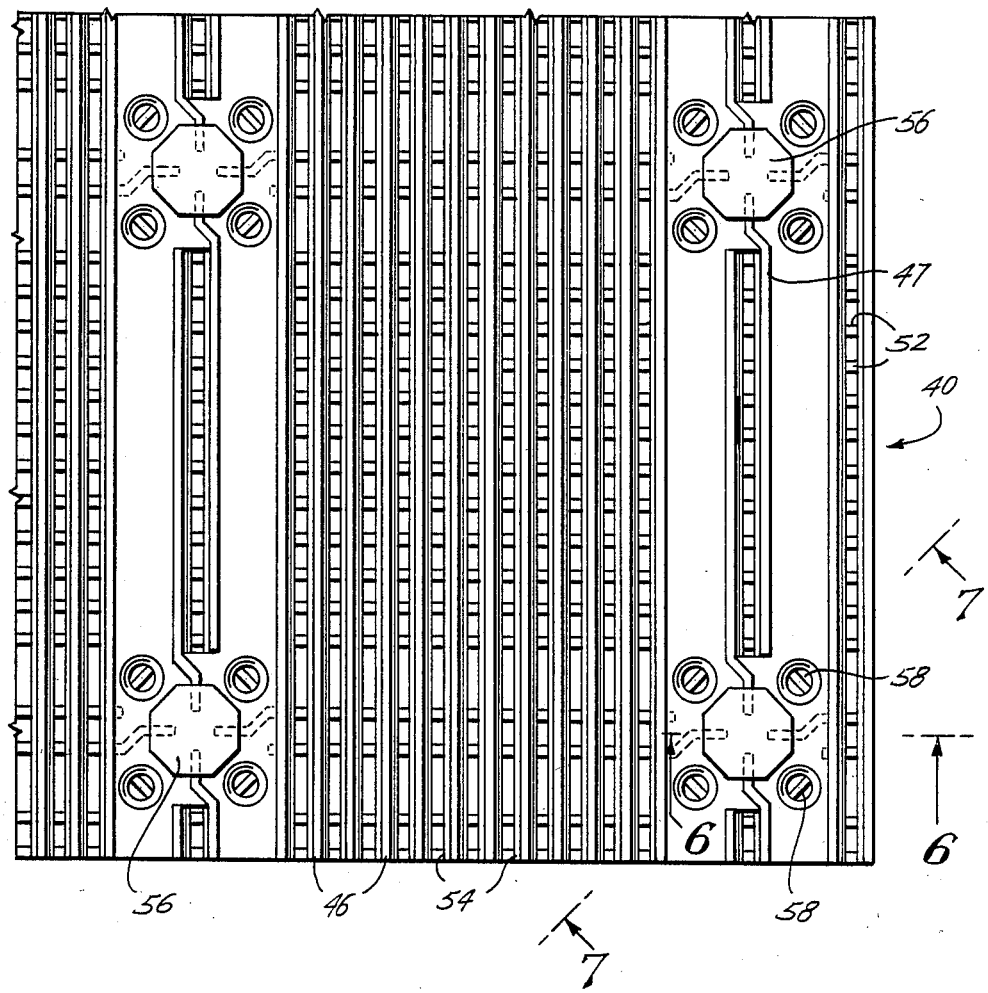
FIG. 3 is a plan view of the interconnect of FIG. 2.

FIG. 3 is a plan view of the interconnect shown in FIG. 2. Like elements in this and other figures are similarly numbered. The wires 46 and 52 form signal nets whereby a signal is carried along a selective path of x- and y-wires. The wires run the full length of the interconnect. The distance between the wires, i.e., the density of the wires, is scalable to the technology with which it is to be used. In the integrated circuit technology, the wires can preferably, for example, be positioned about 40-50 microns apart. However, should the need arise, the wires can be more densely packed, i.e., to even a 5 micron distance. Likewise, should the interconnect be used for a printed circuit application, a less dense design can be provided. Thus, the general interconnect design is constant and only the dimensions vary. Thus, in addition to its present general variability, the interconnect construction will keep pace with sophistication of circuitry construction.

Additional wires 47 connect to the bonding structures 56. Whereas the wires 46 and 52 extend the full length of the interconnect, the wires 47 are shorter and extend between adjacent bond pads. As shown, one end of wire 47 connects to the bonding structure while the remainder of the wire provides access to the network of wires 46 and 52. The wires 47 are fabricated simultaneously with wire 46 and 52 and have the same structure.

As signal carriers, the wires 46 and 52 must be conductive. A wide variety of conductive materials can be used for the wires. Of course, metals are a preferred group of conductive materials. Among the metals, copper, aluminum, gold, silver, tungsten and molybdenum are suggested. These metals combine good conductivity with good processability.

Figure 4:
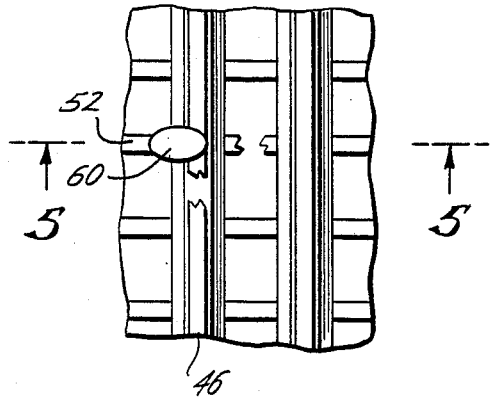
FIG. 4 is an enlarged plan view of a section of the interconnect of FIG. 2.

FIG. 4 illustrates a section of the interconnect after customization. As shown, customization involves two steps. In one step, a link 60 is formed between y-wire 46 and x-wire 52. The link is made of a conductive material, and could be of the same material as the wire. Suggested methods for making the link include deposition, for example, laser deposition or lift off processing through a resist stencil.

In addition to this linking step, the net or signal routing, includes a "breaking" step by which wires are severed to open the circuit. Any processing technique useful for severing the wire can be used here. Etching, e.g., laser etching, is such a technique. Thus, according to FIG. 4, assuming that a signal is to pass through x-wire 52, after customization, the signal will pass along wire 52, link 60, and along y-wire 46.

Figure 5:
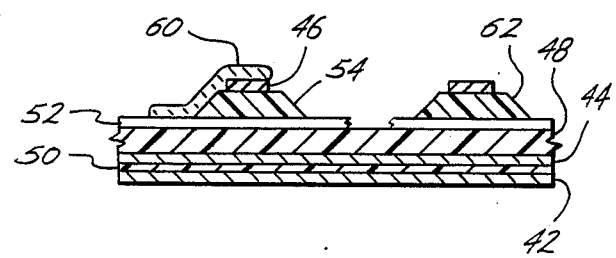
FIG. 5 is a cross-sectional view of the interconnect taken along Line 5—5 of FIG. 4.

The wiring scheme of FIG. 4 is shown in cross-section in FIG. 5. The link 60 is shown as a stepped link of deposited material extending from x-wire 52 to y-wire 46. The interconnect of FIG. 5 also includes a power plane 42 and ground plane 44. Positioned between the planes is a layer of insulation 50. A second insulation layer 48 is provided to the interconnect between plane 44 and x-wire 52.

In keeping with the provision of insulation layers between the conductive layers, a further insulation 54 is provided between wires 46 and 52. Insulation 54 is provided at the areas of overlap between x- and y-wires. Accordingly, the insulation may be in the form of islands positioned between the overlapping wires. In the embodiment illustrated by FIGS. 2-4, however, the insulation is in the form of strips which extend along the full length of the top plane of wires. Also, as FIG. 5 illustrates, the insulative strips 54 have inclined surfaces 62. Such surfaces are preferred to provide a good profile for receiving the link material 60. Vertical edges may also be used depending on the technology chosen for depositing the link. For example, laser-assisted chemical vapor deposition can deposit material on the vertical edges. In the latter case, such strip profiles would be advantageous in that the strips would take up less room and, therefore, line density could be increased. Furthermore, the width of the insulative islands or strips 54 can vary. For example, the material may be of the same width as the wire 46, and possibly, in some cases narrower than the wire. Again, the width, like the profile, of the insulation is process dependent. The only criteria is that the insulation be sufficient to support an adequate link 60 between the wires.

The thickness of the insulative strips or islands 54 can also vary depending on application and design criteria. The insulation should be sufficiently thick to minimize parasitic capacitance between the crossing wires. Typical insulator thicknesses may be approximately 5 $\mu$m for layer 54 when the width of the x and y layers is 10 $\mu$m.

The insulation layers 48, 50, and 54 can be made from any material having a sufficiently low dielectric constant. The selection of the material also depends on its process compatibility. Examples of useful insulative materials include polyimides, silicon oxide and silicon nitride, with polyimides being preferred, especially for layers having a thickness greater than about 5-10 $\mu$m. Additionally, the strips can be patterned using a "self-aligned" process by using the second set of wires as an etch mask.

Figure 6:
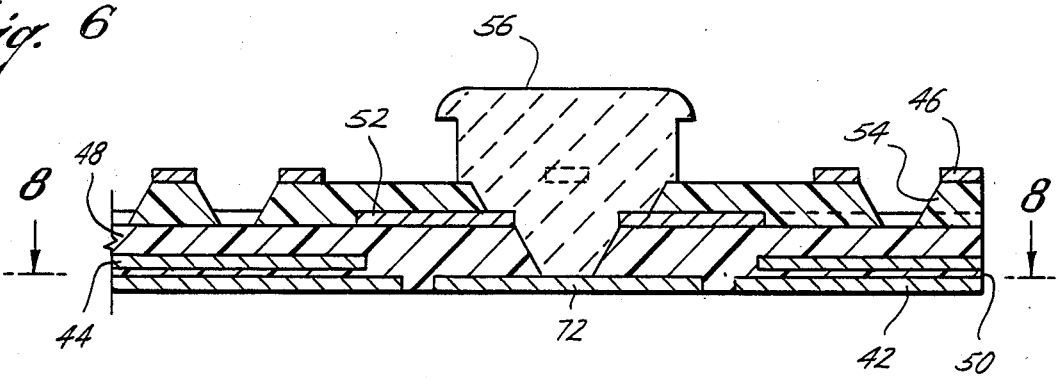
FIG. 6 is a cross-sectional view of the interconnect taken along Line 6—6 of FIG. 3.

FIG. 6 illustrates in cross-section the area of the interconnect about a bonding structure 56. The bonding structure can assume a variety of profiles; in FIG. 6 the structure is in the shape of a bonding pad. The pad 56 is anchored to the underlying substrate of the interconnect. As shown, the pad extends down through the interconnect to the power plane 42. The bonding pads provide a contact surface for bonding to the outer lead bonds of a chip design to be discussed in more detail below. As FIGS. 2 and 3 illustrate, the pads are positioned in parallel rows at predetermined distances. The pitch of, the distance between, the bonding pads is selected as a compromise between bond pad and wire density. As the pitch decreases, the number of full length wires which can be fit between the pads decreases. On the other hand, as will be clearer from the discussion below, a closer packing of the bonding pads results in a closer packing of the chips which are attached to the interconnect. In one preferred embodiment, the pitch of the bonding pads is 25 mils. The size and shape of the pads can also vary. In one preferred embodiment, the pads have a diameter of 4 mils and are generally cylindrical.

The bonding pads are connected to wires 47 extending from the pads vertically and horizontally in either direction. The pads also provide tape automated bonding between the interconnect and chip.

The pads can be formed by a variety of techniques, for example, plating through a resist stencil. The solder is built up into a pre-form profile, such as shown in FIG. 6. The solder is then reflowed to make the necessary connections.

Figure 7:
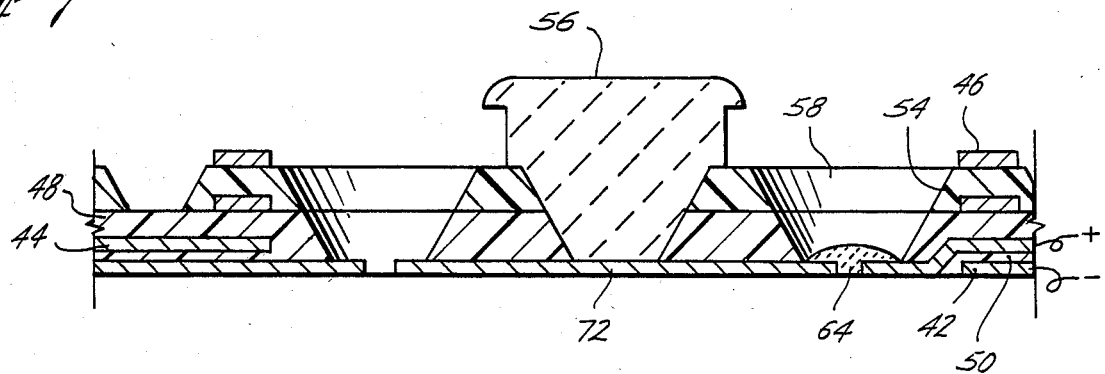
FIG. 7 is a cross-sectional view of the interconnect taken along Line 7—7 of FIG. 3.

FIG. 7 is similar to FIG. 6, except it illustrates a view of the interconnect taken through access areas ("vias") 58 to the lower conductive planes. As shown, these planes are isolated. If it is desired to link the plane(s), for example, to supply power to or to ground the interconnect, a link 64 can be made between the isolated portions through the vias. As is the case with the link 60, the link 64 can be formed by a variety of techniques, including laser deposition.

The vias 58 are illustrated to be in close proximity to the bonding pads 56. While preferred, these vias could be positioned at other positions about the interconnect. The advantage in having the vias close to the bonding pads is to reduce interference with the wires. The vias can assume a variety of shapes; FIG. 7 shows a conical profile.

Figure 6A:
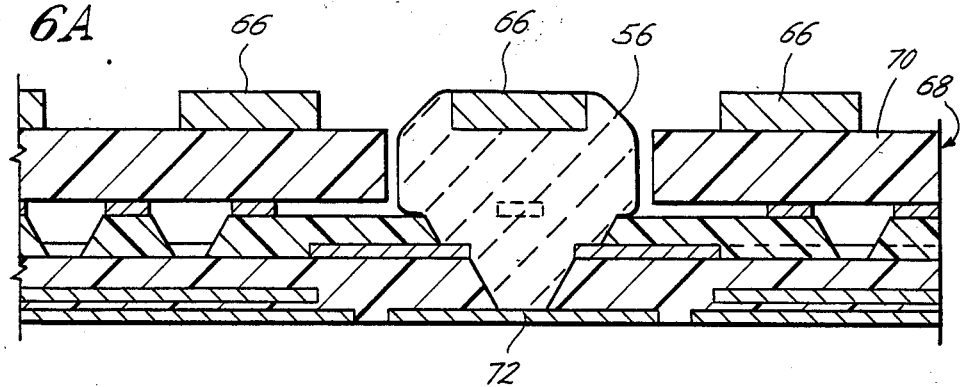
FIG. 6A is a cross-sectional view of an interconnect similar to FIG. 6, except with the addition of a tape chip design according to the present invention.
Figure 7A:
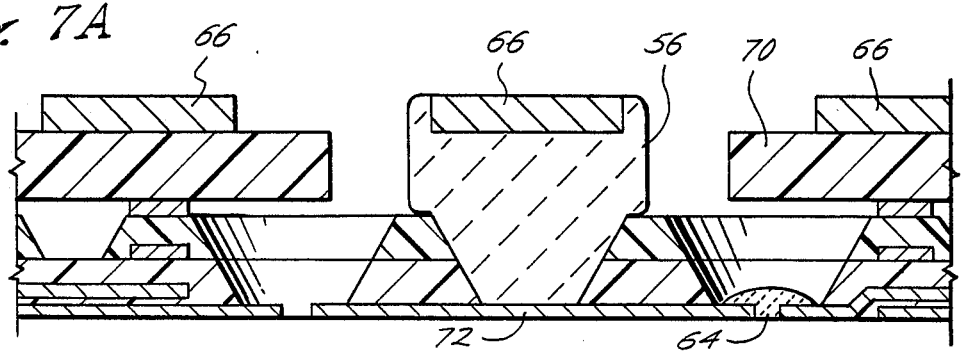
FIG. 7A is a cross-sectional view of an interconnect similar to FIG. 7, except with the addition of a tape design according to the present invention.

As noted above, the bonding pads 56 after being formed on the interconnect, are "reflowed" to form the proper connections. FIGS. 6A and 7A show the bonding pad profile after reflow. During reflow, the bonding pads are contacted with and attached to the outer lead bonds of a tape automated bonded chip. The bonding pad 56 is attached to one of the leads 66 from the tape 68. In the embodiment illustrated in FIGS. 6A and 7A, the tape 68 includes the support tape 70 onto which the leads 66 are attached.

Figure 8:
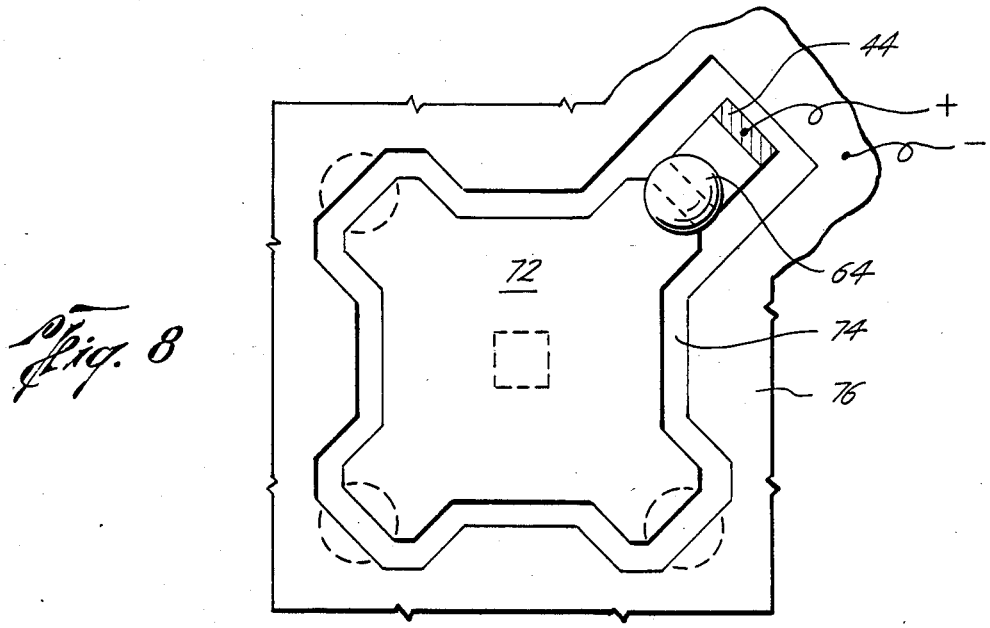
FIG. 8 is a cross-sectional view of the lower conductive plane of the interconnect taken along Line 8—8 of FIG. 6.

FIG. 8 illustrates the structure of the interconnect in the area of the conductive planes 42 and 44 and the link 64. As previously described, the portion 72 of the power plane 42 at the solder bump pad is isolated. As viewed from the top, the plane portion 72 has the shape shown in FIG. 8. The track 74 is a channel separating the plane portions. The link 64 between the ground 44 and the portion 72 is shown. As depicted by FIG. 7, the ground plane is brought down to same plane as portion 72. The non-connected power plane portion 76 is shown about the perimeter of the track 74.

FIGS. 3 and 8 illustrate four vias 58 positioned around bonding pad 56. In one embodiment, the vias may provide access to up to three different power planes, i.e., three different voltages, and one ground plane. Alternatively, one or more of the power vias may be replaced by a built-in termination resistor.

Figure 9:
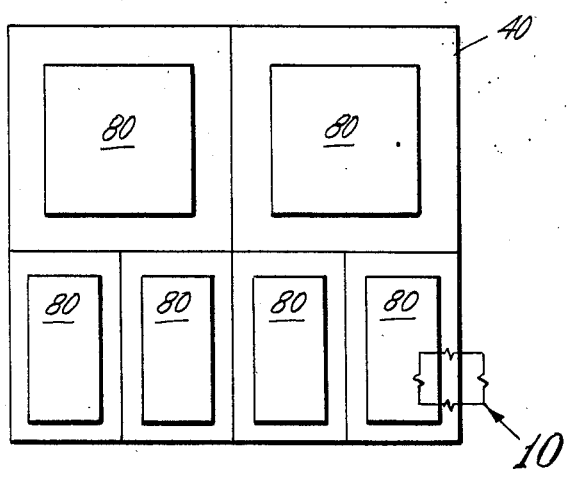
FIG. 9 is a schematic, plan view of an interconnect according to the present invention having a number of chips attached thereto.

The uniformity of the interconnect offers the advantageous prospect of equally uniform, undedicated tape-automated-bonding (TAB) design. FIG. 9 illustrates the uniformity of chip placement design achieved by such interconnect and tape design. A number of integrated circuit chips 80 are shown arranged on an interconnect 40. By enabling such a layout, interconnect space can be preserved.

The interconnect of the present invention is compatible with a wide variety of chip types, sizes and lead counts to maximize its usefulness and thereby minimizing costs. Techniques for chip bonding include, for example, tape automated bonding (TAB), wire bonding, C4 bonding, etc. particularly useful with the present interconnect are TAB chips. TAB-type bonding involves the mounting of the integrated circuit chips on a carrier film or tape. The tape, for example, may comprise a very thin polyimide strip. The chip is affixed to the tape by means of the chip's outer signal and power leads. These leads are generally formed of copper and typically plated with tin, or noble metals such as gold, platinum, etc.

Typically, the leads extend from the centrally positioned chip in all directions. The leads generally have inner and outer lead bondsites. The inner lead bondsites (ILB's) connect the leads to the chip; the outer lead bondsites (OLB's) connect the leads to the interconnect. Because of the small scale at which the bonding must be performed, it is desirable to have center-to-center distances between adjacent OLB's sufficient to prevent overlap of the bonding connections between two bondsites which result in shorting the connection. This design objective, however, must be balanced against the need to use as little bonding area as possible in order to allow compact chip mounting. In other words, if one were to spread out the OLB's over an interconnect to facilitate the bonding of the individual leads to the interconnect, it would result in the adjacent chips being positioned at greater distances from one another and thus fewer chips per unit area would be accommodated.

Figure 10:
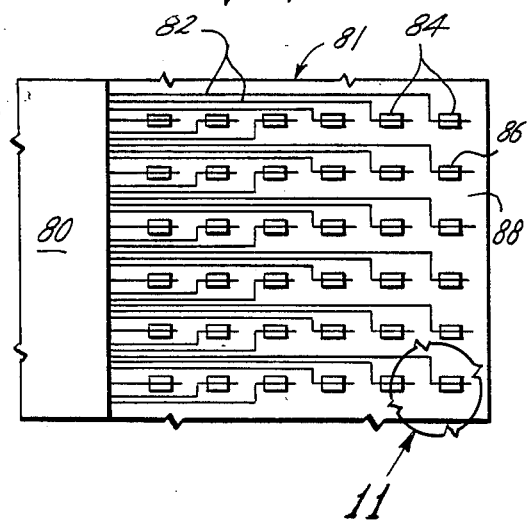
FIG. 10 is an enlarged, plan view of the area array outer lead bonds of the chip design of the present invention taken at Section 10 of FIG. 9.

The present interconnect circuitry also includes the provision of a tape design for improved tape automated bonding for use with the present interconnect. The tape design allows for more dense packing of chips onto an interconnect. The tape design utilizes "area" outer lead bonding. FIG. 10 illustrates this design. Area outerlead bonding has all OLB pads placed on a standard grid, e.g., to correspond to the grid of the underlying interconnect. The leads 82 extend from a chip 80 to outer lead bondsites 84. The bondsites are arranged in rows, the number of which depends on chip size and lead count. The bondsites 84 comprise a window or cut-out 86 through the tape 88. The lead 82 extends across this window 86. The joints between the leads and the bump pads of the underlying interconnect are formed through these windows 86.

Figure 11:
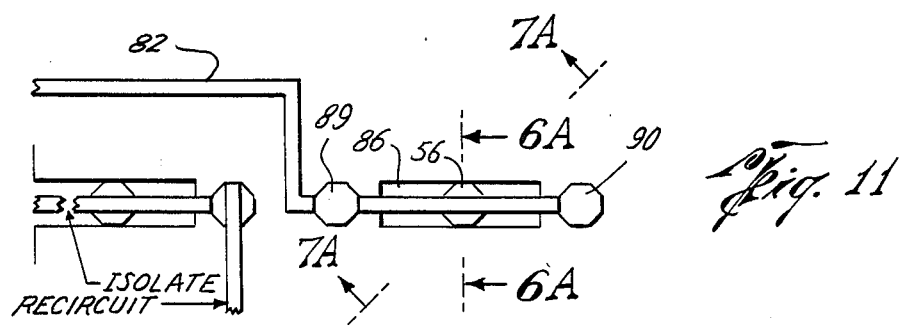
FIG. 11 is a further enlarged plan view of a section of the outer lead bonding design of the present invention taken at Section 11 of FIG. 10.

An enlarged view of two of the outer lead bond sites is shown in FIG. 11. The lead 82 is shown coming from the chip and extending across the window 86 of the bondsite 84. The bump pad 56 of the interconnect is shown contacting with the lead through the window.

As with the interconnect, the area grid can also vary with application and design criteria. If for example, bonding pads of the interconnect are at a 24 mil pitch, the bondsites 84 are similarly positioned. Assuming an inner lead bond pitch of 4 mils, the TAB design of FIG. 10 positions six bondsites in a laterally extending row at a 24 mil pitch.

The corners of the area grid may also be used, in which case fewer rows of OLB sites may be required and the chip "footprint" may be smaller.

The tape itself may also support engineering change pads. As shown in FIG. 11, the pads 89 and 90 can be placed on either side of the window 86. These pads can be used, for example, to wire bond "yellow wires" or microcoax for engineering changes after chips are attached. These pads can also be used for test purposes. Specifically, pad 90 of the two pads 89 and 90 could be used as a test pad since any probe damage to the pad would not destroy the lead.

The area array outer lead bonding for TAB chip design has the following advantages, (1) the required alignment accuracy for outer lead bonding is reduced, (2) a standard OLB footprint is provided which matches the fixed area array of pads on the interconnect described above, (3) short leads are provided which can be used for 25 low inductance power connections, and (4) compliancy, an advantage offered by TAB design, is retained.

Turning to the tape design, generally the tape may use two metal layers. The metal layers help to minimize self and mutual inductance of the leads. However, a single layer tape, i.e., one metal layer and no ground plane, can be used. This tape simplifies manufacture.

If the tape has uninsulated metal facing the interconnect, some type of insulation must be provided between the tape and the wiring on the interconnect. One solution is to provide a further insulation layer to the tape bottom. Additionally, should it be necessary to shield the wiring of the interconnect from the interior of the chip, a ground plane can be provided to the tape.

Finally, testing of the circuitry can be done directly on the pads. In addition, the present OLB design allows for inspectable bonds between the interconnect and the outer leads.

In addition to the designs discussed above, alternative designs for both the interconnect and tape, some of which are discussed below and illustrated by FIGS. 12-19, are available.

Figure 12:
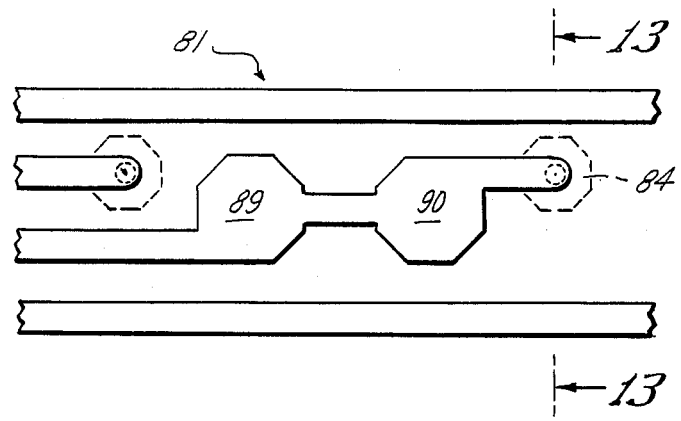
FIG. 12 is an alternative tape chip design according to the present invention.
Figure 13:
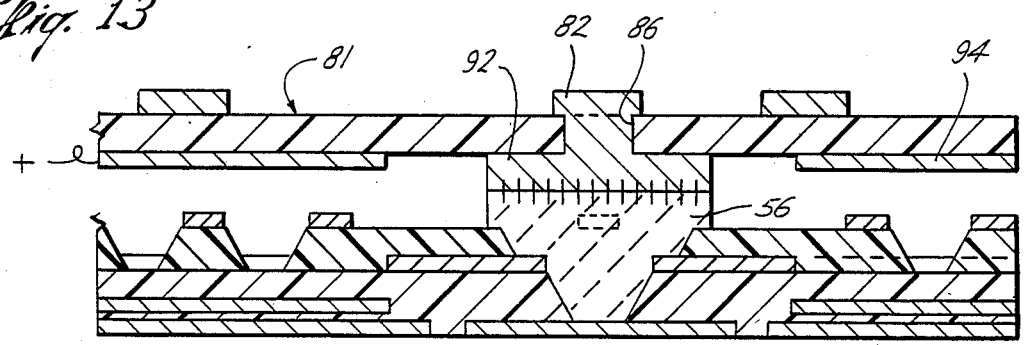
FIG. 13 is an enlarged, cross-sectional view of the tape design taken along Line 13—13 of FIG. 12 attached to the underlying interconnect.

FIGS. 12-18 depict various bonding pad and tape designs for connecting the chip to the interconnect. FIG. 12 illustrates a tape 81 in which the pads 89 and 90 are positioned on the same side of the bondsite 84. The bond region is shown in cross-section in FIG. 13. The lead is attached to a metal pad 92 through the window 86. The metal pad extends below the tape 81 and contacts the bonding pad 56 of the interconnect. In addition, the tape includes a reference plane 94. The plane 94 provides controlled impedance to the circuitry.

Figure 14:
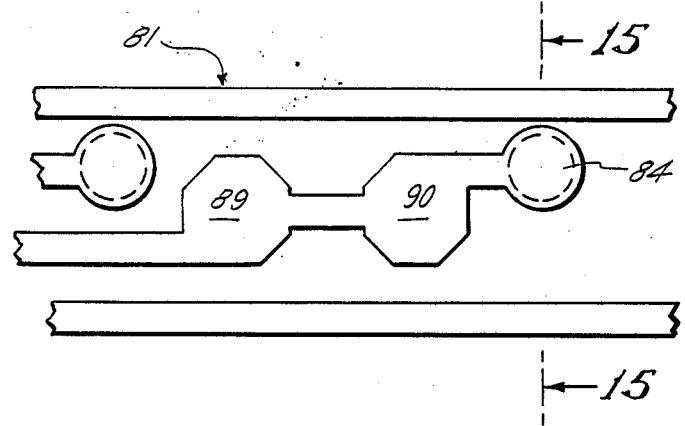
FIG. 14 is another alternative tape chip design according to the present invention.
Figure 15:
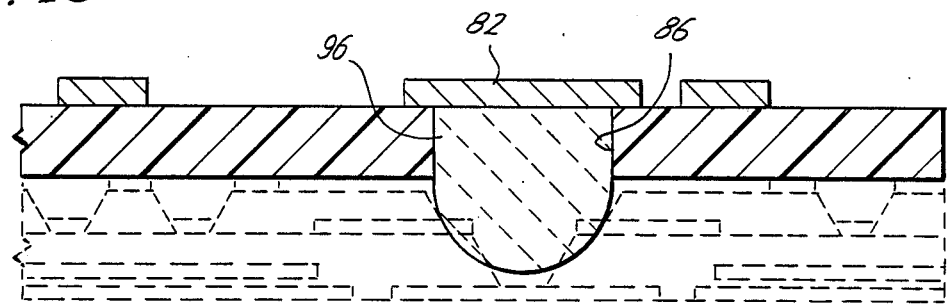
FIG. 15 is an enlarged, cross-sectional view of the tape design taken along Line 15—15 of FIG. 14 attached to the underlying interconnect.

Like FIG. 12, FIG. 14 also illustrates an embodiment wherein the pads 89 and 90 are positioned on the same side of the bondsite 84. FIG. 15 is a cross-sectional view of the bondsite of the tape. According to this embodiment, the bonding metal 96 is plated directly onto the bottom side of the lead 82 through the window 86 of the tape.

Figure 16:
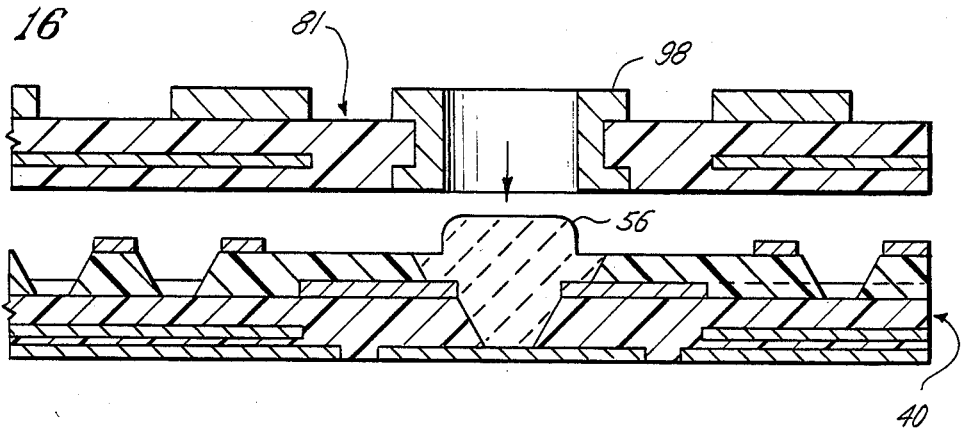
FIG. 16 is still another alternative tape chip design according to the present invention.
Figure 17:
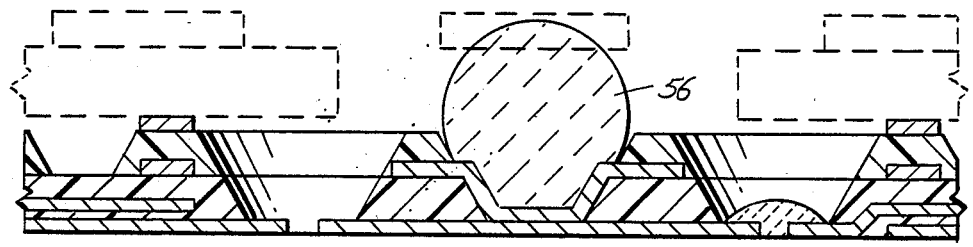
FIG. 17 is a cross-sectional view of another alternative bonding attachment design of the present invention for bonding the tape to the interconnect.
Figure 18:
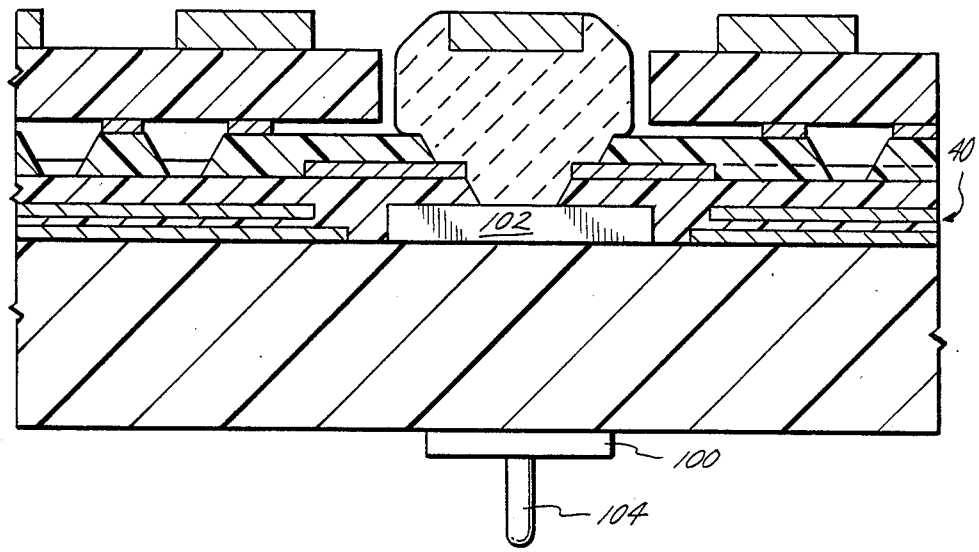
FIG. 18 is a cross-sectional view of an attached tape and interconnect design having a conductive connection between the bonding means of the interconnect and a pin extension on the opposite side of the interconnect.

FIG. 16 illustrates an embodiment wherein a two level tape 81 includes a plated-through window 98 which contacts with the bonding pad 56 of the interconnect 40. In FIG. 17, the bonding pad 56 is formed on the interconnect 40 by screening solder paster, for example, by the "shaker-table" or dipping techniques.

The bonding materials shown by FIGS. 15 and 17 are subsequently reflowed to form the necessary connections to the interconnect.

The interconnect of the present invention can be designed with an area pin-grid-type array for interconnect-to-interconnect connection. According to FIG. 18, a pad area 100 is provided on the bottom surface of the interconnect. The pad is attached to the lower level of metallization 102 of the interconnect through a via in the interconnect. A pin 104 is then attached to the pad 100. The pan can be attached, therefore, to the power planes, ground plane and/or termination resistor. The connection to the bonding structure is firmly fixed.

The area pin-grid array can be used to bring power to the circuitry. In this embodiment, the power/ground combination forms a multiplicity of decoupling capacitors. Accordingly, the discretionary pad connections would include two capacitors, one ground and one resistor.

Figure 19:
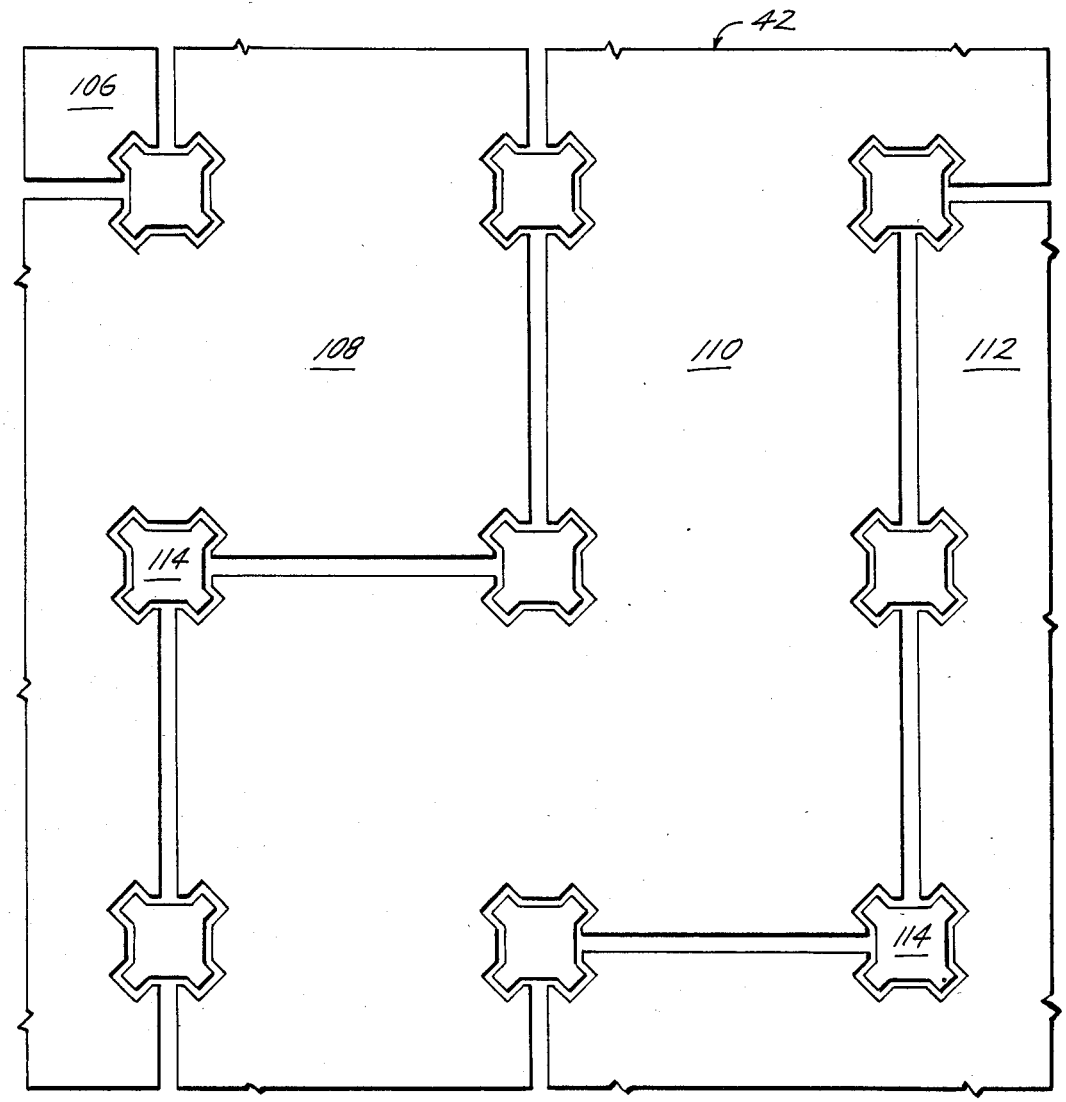
FIG. 19 is a plan view of an alternative design of the power distribution plane according to the present invention.

As has been discussed, the power plane 42 can be sectionalized to provide more than one voltage to the interconnect. Such a power plane is shown in FIG. 19. The power plane is divided into strips 106, 108, 110 and 112 which extend between the area array of outer lead bondsites. The power distribution network can be personalized using a power connector which connects at the bondsite 114. As the figure illustrates, the power strips can be routed at a slanted angle to maximize the usage of all available strips. For example, in the embodiment in which the chips are attached in a square array, the strips between the chips will draw more current than the strips which run under the chips, if the power strips were not slanted.

The interconnect of the present invention can be produced by a variety of methods. The manufacturing method described below is used to form an interconnect having a ground plane, a power plane, and two layers of conducting wires with insulation therebetween. As will become apparent from the discussion below, the various steps can be excluded or repeated to produce the specific interconnect designs previously discussed. In accordance with one method for manufacturing the interconnect, a supporting substrate, such as ceramic or other material, is selected to receive the conducting layers of the interconnect. The support may be rigid or flexible. A conductive material is then deposited on the interconnect to form a lower power plane for the conductive wires. The conductive materials can be deposited by any conventional method, including evaporation, sputtering, electroless plating, electroplating or lamination. The film can be patterned by conventional techniques, additive or subtractive. Optionally, a dielectric layer may be formed between the supporting substrate and the plane. This process is repeated to form the ground plane. An additional dielectric layer is placed on top of the power layer to separate this layer from the ground plane. Additionally, a further dielectric is placed on the ground plane to separate this layer from the interconnect wire layers which follow.

The lower layer of conductive wires is formed by etching a blanket layer of metal which is applied in the same manner as the lower reference layer. Alternatively, a lift-off technique or plating method may be used to form the conductors.

A further dielectric layer is used to separate the lower conductive layer from the upper conductive layer. This dielectric may be applied by any conventional method for deposition and patterning.

The second layer of conductive wires is formed in a manner which may be identical to that for forming the first layer of conductive wires. The layers of conductive wires are designed to receive the bonding structures positioned at regular intervals about the interconnect. In order to provide the bonding structures, the wire segments are terminated in the vicinity of the bonding structures to provide room for same and for the access areas to the lower conductive planes positioned about the bonding structures.

The bonding structure itself can be either bonding pads extending from the interconnect or from the tape. In either case, the pads can be formed by plating through a resist-mask.

As can be understood from the above discussion, these various techniques can be repeated or modified to produce a variety of specific interconnect structures, depending on user needs.

In addition to the advantages of the present structure discussed above, because the present interconnect is open from the top, any routing scheme can be specified to the interconnect simply by linking and severing the necessary wires. It is not necessary to remove or short through the insulation (like in Mosaic).

The primary application of the present interconnects is to provide high performance multi-chip customizable circuitry. The high cost typically associated with such interconnects is lowered dramatically by the present universal interconnect. By avoiding the use of fully custom wiring, volume and yield are increased and the end user is thus responsible for only a small fraction of the overall fabrication. By taking advantage of a compatible chip bonding design, density and flexibility of the resulting customizable circuitry is greatly enhanced.

The present invention, therefore, is well adapted to carry out the objects and obtain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. An interconnect for connecting electrical components, comprising:
   at least one conductive plane;
   a first set of essentially parallel electrically conductive wires forming a regular structure which is repeated stepwise across said interconnect;
   a first insulation layer separating said at least one conductive plane and said first set of wires;
   a second set of essentially parallel electrically conductive wires forming a regular structure which is repeated stepwise across said interconnect, said second set of wires being non-planar and non-parallel to and forming areas of wire overlap with said first set of wires;
   a second insulation layer separating said first set of wires and said second set of wires;
   means for connecting overlapping wires at said areas overlap;
   means, positioned about said interconnect, for bonding said interconnect to an attached electrical component, respective subsets of said said first and second sets of wires being between adjacent bonding means; and
   access areas, in proximity to said bonding means, extending through said interconnect to said at least one conducive plane, to allow selective electrical connection between said bonding means and said at least one conductive plane.

2. An interconnect as claimed in claim 1, wherein said at least one conductive plane includes a power plane.

3. An interconnect as claimed in claim 1, wherein said at least one conductive plane includes a ground plane.

4. An interconnect as claimed in claim 1, wherein said at least one conductive plane includes a power plane and a ground plane.

5. An interconnect as claimed in claim 1, wherein said at least one conductive plane includes a power plane, a ground plane, and a resistor plane.

6. An interconnect as claimed in claim 1, wherein said first insulation layer comprises a plurality of strips of insulation extending along one of said set of wires.

7. An interconnect as claimed in claim 6, wherein said insulative strips have sloped side surfaces of increasing width from top to bottom.

8. An interconnect as claimed in claim 1, wherein said bonding means extends through the interconnect to said at least one conductive plane.

9. An interconnect as claimed in claim 1, wherein said bonding means is a bonding pad.

10. An interconnect as claimed in claim 1, wherein said bonding means comprises a recess for receiving a bonding element.

11. An interconnect as claimed in claim 10, wherein said bonding element extends through the interconnect and electrically connects with a conductive extension extending from an opposite side of the interconnect.

12. An interconnect as claimed in claim 2, wherein said power plane comprises a plurality of strips extending along the interconnect.

13. An interconnect as claimed in claim 12, wherein said power strips have different voltages.

14. An interconnect as claimed in claim 12, wherein said power strips extend diagonally along the interconnect.

15. An interconnect as claimed in claim 1 wherein said first and second sets of wires are metal selected from the group consisting of copper, aluminum, silver, gold, tungsten and molybdenum.

16. An interconnect as claimed in claim 15, wherein said metal is copper.

17. An interconnect as claimed in claim 1, wherein said first and second insulation layers are a material having a low dielectric constant.

18. An interconnect as claimed in claim 17, wherein said first and second insulation layers are selected from the group consisting of polyimide, silicon oxide, and silicon nitride.

19. An interconnect as claimed in claim 18, wherein said first and second insulation layers comprise a polyamide.

* * * * *

UNITED STATES PATENT AND TRADEMARK OFFICE
CERTIFICATE OF CORRECTION

PATENT NO. : 4,888,665

DATED : December 19, 1989

INVENTOR(S) : Lawrence N. Smith

It is certified that error appears in the above-identified patent and that said Letters Patent is hereby corrected as shown below:

Column 14, Claim 19, line 54, change "polyamide" to --polyimide--.

Signed and Sealed this

Twenty-fifth Day of June, 1991

Attest:

HARRY F. MANBECK, JR.

*Attesting Officer*

*Commissioner of Patents and Trademarks*